United States Patent [19]
Kozlovsky et al.

[11] Patent Number: 5,095,491
[45] Date of Patent: Mar. 10, 1992

[54] LASER SYSTEM AND METHOD

[75] Inventors: William J. Kozlovsky; William P. Risk, both of Mountain View, Calif.

[73] Assignee: International Business Machines Corporation, Armonk, N.Y.

[21] Appl. No.: 685,306

[22] Filed: Apr. 12, 1991

[51] Int. Cl.$^5$ ............................................. H01S 3/083
[52] U.S. Cl. ..................................... 372/94; 372/108; 372/27; 372/21
[58] Field of Search ...................... 372/94, 108, 21, 27, 372/92, 98, 75, 60

[56] References Cited

U.S. PATENT DOCUMENTS 4,791,631  12/1988  Baumert et al. ........................ 372/22
5,048,047   9/1991  Kozlovsky et al. ..................... 372/92

OTHER PUBLICATIONS

L. Goldberg and M. K. Chun, "Applied Physics Letters", vol. 55, p. 218, Jul. 17, 1979.
P. Gunter, et al., "Applied Physics Letters", vol. 35, p. 461, Sep. 15, 1979.
A. Ashkin, et al., "IEEE Journal of Quantum Electronics", vol. QE-2, p. 109, Jun. 1966.
W. J. Kozlovsky, et al., "IEEE Journal of Quantum Electronics", vol. 24, p. 731, Jun. 1988.
J. C. Baumert, et al., "Applied Physics Letters", vol. 51, p. 2192, Dec. 1987.

Primary Examiner—Léon Scott, Jr.
Attorney, Agent, or Firm—Douglas R. Millett

[57] ABSTRACT

A laser system uses a nonlinear ring resonator to produce Type-II nonlinear second harmonic generated light. The reflective surfaces of the resonator are all symmetrical with respect to the crystal axes. This allows orthogonally polarized light to be resonated along the same beampath in the resonator without experiencing bireflection.

14 Claims, 6 Drawing Sheets

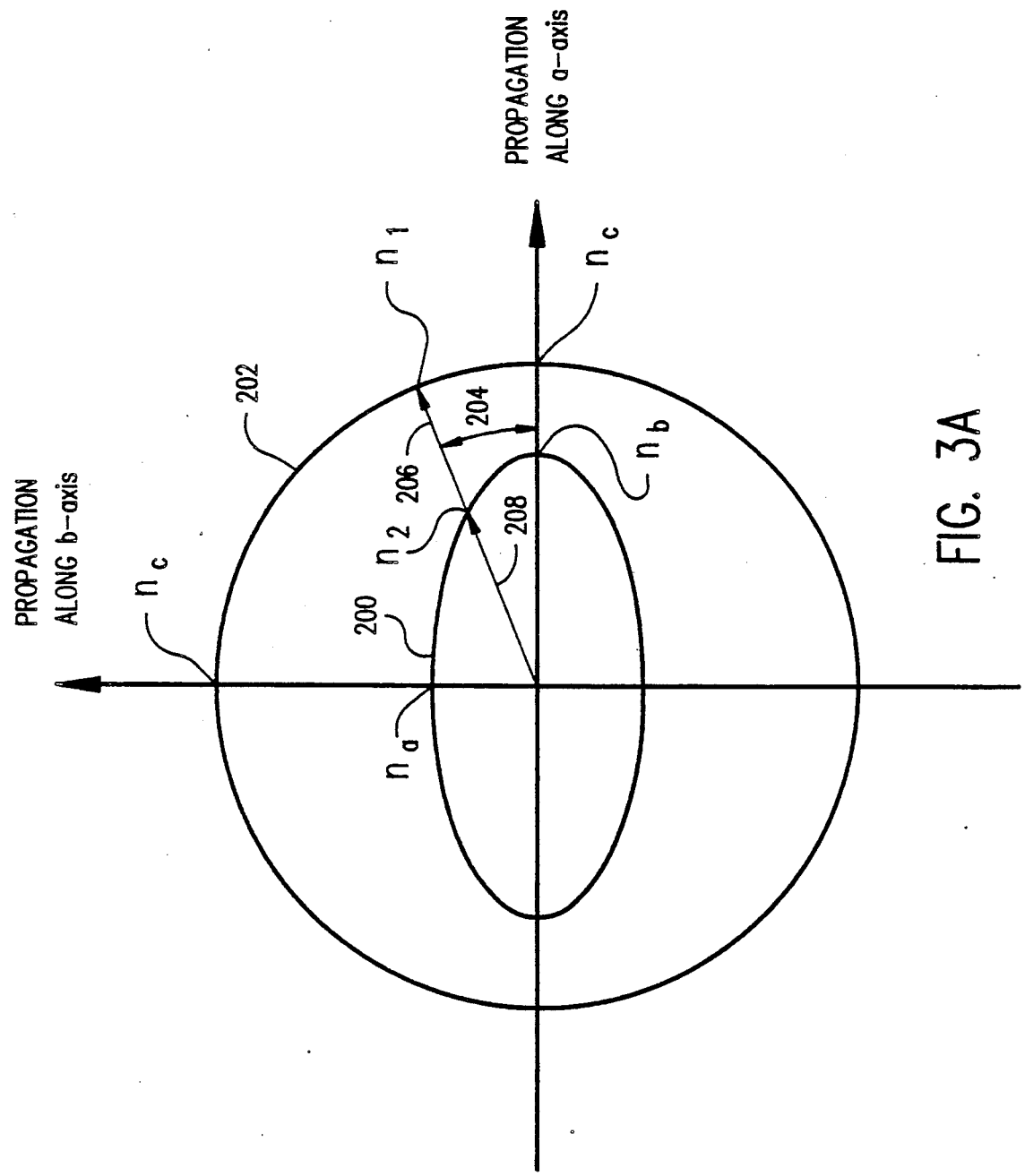

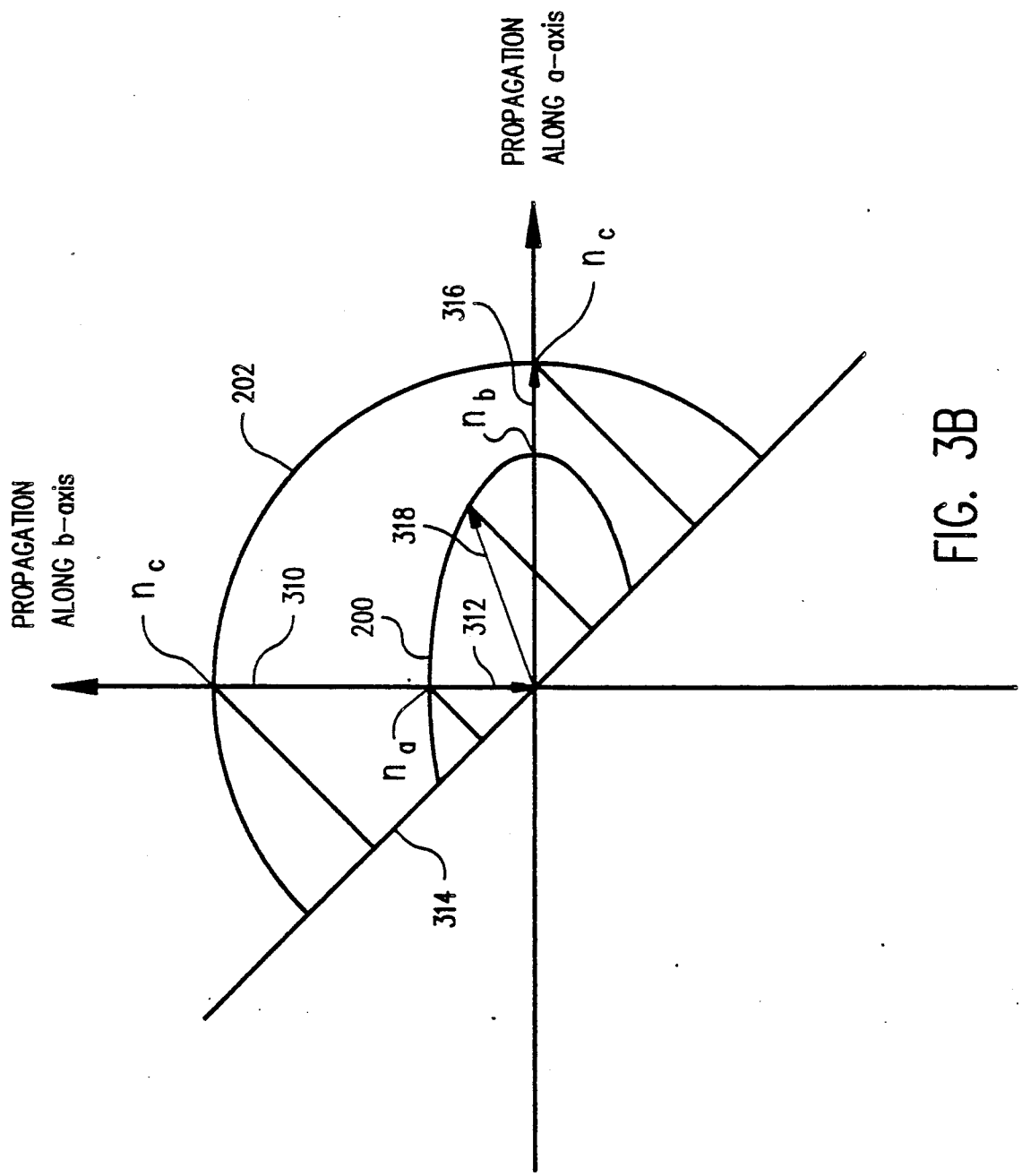

LASER SYSTEM AND METHOD

BACKGROUND OF THE INVENTION

1. Field of the Invention

This invention relates to laser systems and more particularly to laser systems which produce light by frequency doubling or sum-frequency mixing.

2. Description of the Prior Art

Semiconductor diode lasers are of interest for a number of applications such as optical data storage, laser printing, and biochemical analysis. One example is the gallium-aluminum-arsenide (GaAlAs) diode laser which generates laser light in the near-infrared range (750–860 nm in wavelength). In optical data storage systems, the light from the laser diode is focused onto a spot on the optical disk in order to record each bit of data. The spot size is equal to approximately $\lambda/(2*(N.A.))$, where $\lambda$ is the wavelength of the light and (N.A.) is the numerical aperture of the focusing lens. In typical systems, the (N.A.) is approximately 0.5 and the resulting spot size is approximately 800 nm in diameter.

It is apparent that if the wavelength of the laser light can be cut in half, the diameter of the spot size will also be cut in half and the overall storage density on the optical disk may be quadrupled. Unfortunately, laser diodes that produce light in the blue wavelength range (430 nm in wavelength) are not available.

One technique to convert light to a higher frequency (shorter wavelength) is known as second harmonic generation (SHG). A laser beam at a first lower frequency is passed through a nonlinear crystal, such as potassium niobate ($KNbO_3$), which produces a second harmonic laser beam (i.e., a beam at twice the frequency of the original laser beam which entered the nonlinear crystal). This SHG technique is discussed in articles by M. K. Chun, et al., Applied Physics Letters, Vol. 55, p. 218, July 17, 1989; and P. Gunter, et al., Applied Physics Letters, Vol. 35, p. 461, Sept. 15, 1979.

However, since the diode laser's output power is low, techniques to improve the second harmonic generation efficiency are required in order to produce a useful and efficient laser system.

One way to increase the efficiency of the SHG scheme is to place an optical resonator or cavity around the nonlinear crystal. The light is reflected back and forth through the crystal inside the resonator in order to generate a substantial amount of the blue light. This technique was originally proposed and demonstrated by Ashkin, et al., IEEE Journal of Quantum Electronics, Vol. QE-2, p. 109, 1966. Other examples include Goldberg, et al., Applied Physics Letters, Vol. 55, p. 218, 1989; and Baer, et al., Conference on Lasers and Electro-Optics, Paper THM5, 1989. Frequency doubling of GaAlAs diode lasers using a build-up cavity containing a nonlinear crystal such as potassium niobate ($KNbO_3$) offers the potential for the design of simple, compact laser systems. For the build up to occur, the external cavity resonance frequency must match the diode laser frequency, and the prior art includes a variety of techniques for achieving this frequency matching (e.g., Dixon, et al., Optics Letters, Vol. 14, p. 731, 1989; R. W. Drever, et al., Applied Physics B, Vol. 31, p. 97, 1983; and W. J. Kozlovsky, et al., IEEE Journal of Quantum Electronics, Vol. 24, p. 913, 1988.)

Heretofore, the nonlinear crystal $KNbO_3$ has been used for resonantly enhanced frequency doubling of GaAlAs laser diodes. Potassium niobate has a large nonlinear coefficient and sufficient birefringence for phasematching of second-harmonic generation at the wavelengths of GaAlAs laser diodes. However, this phasematching is very sensitive to the temperature of the crystal, and this temperature must be precisely controlled to maintain efficient second-harmonic generation.

Nonlinear crystals other than $KNbO_3$ have been shown to have phasematching properties advantageous for generation of blue/green light by frequency upconversion of semiconductor laser diodes. In particular, potassium titanyl phosphate ($KTiOPO_4$, KTP) can be used for second-harmonic generation of 990 nm strained-layer InGaAs laser diodes (e.g., W. P. Risk, et al. Applied Physics Letters, Vol. 55, No. 12, p. 1179, and pending U.S. patent application Ser. No. 07/570,251 filed Aug. 17, 1990 by Harder, et al.) and has been shown to have broad temperature tolerances in that application. Similarly, sum-frequency mixing in KTP (e.g., J. C. Baumert, et al. Applied Physics Letters, Vol. 51, p. 2192, 1987 and U.S. Pat. No. 4,791,631) of a wavelength <994 nm with a wavelength >994 nm supplied by a combination of GaAlAs and InGaAs lasers can be used to generate virtually any blue/green wavelength between 450 nm and 500 nm.

The nonlinear processes described above in KTP require the presence of two orthogonally polarized infrared lightwaves in order to be efficient. Such interactions are known as Type-II nonlinear interactions. This is in contrast to the case of second-harmonic generation in $KNbO_3$ where only one polarization is required (Type-I nonlinear interaction). Hence, to enhance the efficiency of a Type-II nonlinear interaction requires that two lightwaves having orthogonal polarizations, at the same or different wavelengths, be simultaneously resonated.

Monolithic resonators have reflective surfaces which are integrally formed on the nonlinear crystals such that the resonating lightwaves never leave the nonlinear crystal. This is highly desirable for reasons of efficiency, stability, and compactness. The preferred configuration in a Type-I nonlinear process is a triangular ring resonator which has a three sided beampath.

The inventors have discovered that enhancement of a Type-II nonlinear process has never previously been demonstrated in a monolithic ring resonator, due to the phenomenon of bireflection. Bireflection causes the ring path to depend on polarization of the light wave, so that the two polarizations required for a Type-II interaction cannot be simultaneously resonated in a triangular three-mirror monolithic ring, such as that used for Type-I interactions. What is needed is a new ring resonator geometry that permits both of the waves required for the Type-II interaction to be simultaneously resonated along the same ring path.

SUMMARY OF THE INVENTION

In the preferred embodiment of the present invention, a monolithic ring resonator consisting of four reflecting surfaces polished directly onto the KTP crystal is designed to create a rhomboid-shaped ring path within the KTP crystal. This rhomboidal ring path is designed to be geometrically symmetric about an axis of crystal symmetry for the KTP crystal. This arrangement defines a closed ring path independent of the polarization or wavelength of the light.

Light from each of two diode lasers is passed through a collimating lens, a circularizing prism, a Faraday isolator, and a focusing lens. The focusing lens directs the light into the nonlinear crystal. The angle of incidence for the two beams is different, depending on the wavelength and polarization of the light. The two lasers are locked to resonant frequencies of the cavity by one of the techniques referenced above as part of the prior art.

Inside the nonlinear crystal, both input beams follow the same rhomboidal path through the crystal and build-up to high powers due to resonant enhancement. Blue/green light is generated through the nonlinear interaction and is transmitted out of the monolithic KTP crystal.

For a fuller understanding of the nature and advantages of the present invention, reference should be made to the following detailed description taken in conjunction with the accompanying drawings.

BRIEF DESCRIPTION OF THE DRAWINGS

FIG. 3A is a slowness curve which describes the propagation of light in an anisotropic optical crystal;

FIG. 3B is a slowness curve which shows the problem of bireflection which prevents a triangular ring path from being used in the resonator of FIG. 1;

DESCRIPTION OF THE PREFERRED EMBODIMENTS

Figure 1:
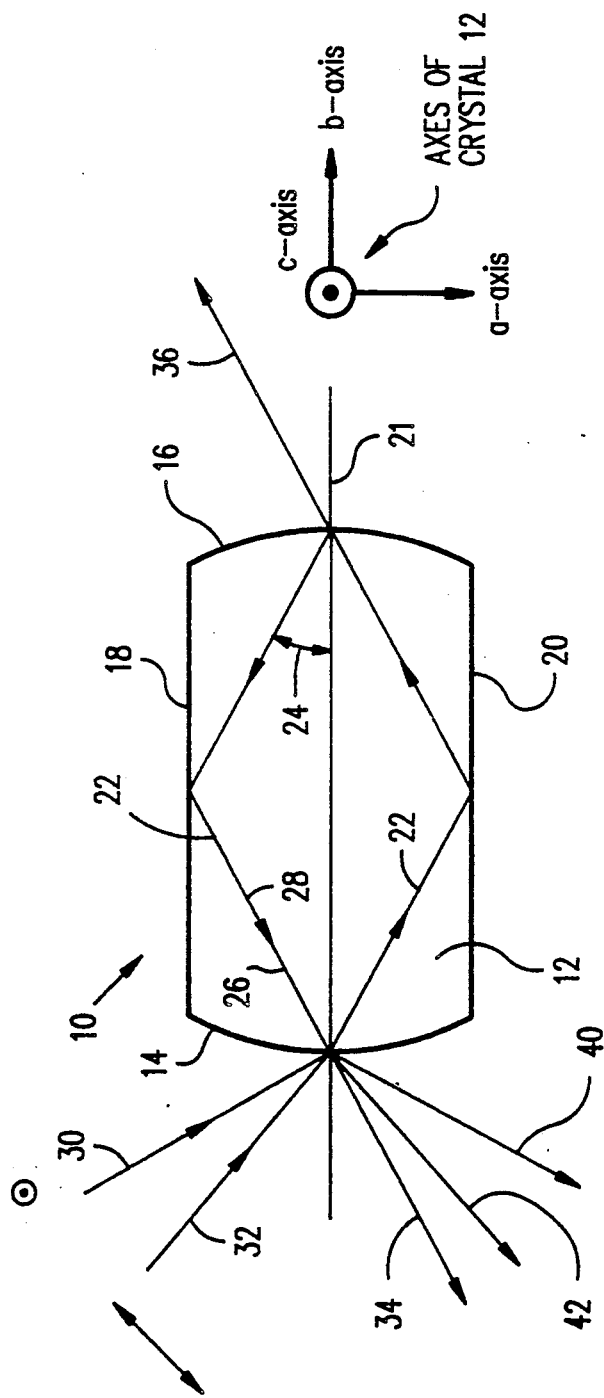
FIG. 1 shows a schematic diagram of the rhomboidal-path monolithic ring resonator of the present invention.

FIG. 1 shows a nonlinear resonator of the present invention and is designated by the general reference number 10. Nonlinear resonator 10 is fabricated from a nonlinear crystal material 12, such as potassium titanyl phosphate (KTP). The specific material 12 is polished to have two curved mirrors 14 and 16 at both ends and flat total-internal-reflection surfaces 18 and 20 parallel to each other and to the mirror axes. Mirrors 14 and 16 are formed of dielectric coatings deposited directly on the polished ends of the crystal. The orientation of the nonlinear crystal 12 is chosen so a mirror axis 21 lies along an axis of crystal symmetry, to eliminate bireflection and to permit phasematching using the maximum birefringence available in the crystal. Nonlinear crystals have crystallographic axes a, b and c as are known in the art. In the preferred embodiment using KTP as the nonlinear crystal 12, the mirror axis 21 is chosen to lie along the crystallographic b-axis and the surfaces 18 and 20 are perpendicular to the a-axis.

The spacings of the curved mirrors 14 and 16 and the flat total-internal-reflection mirrors 18 and 20 are chosen to provide a closed four sided stable mode ring path 22 within the crystal. Ring path 22 describes the path of propagation within the nonlinear crystal 20 of two resonator modes 26 and 28. Resonator mode 26 comprises light having polarization perpendicular to the plane of ring path 22; resonator mode 28 comprises light having polarization parallel to the plane of ring path 22. The spatial distribution of optical energy in these two modes may be slightly different due to differences in wavelength and refractive index; however the energy in both modes occupies substantially the same volume (i.e., they travel the same ring path). In addition, the frequencies at which the nonlinear resonator 10 is resonant and causes intensity build-up in the modes 26 and 28 is different for the two modes due to differences in the refractive index. The radii of curvature of the curved mirrors 14 and 16 are preferrably chosen to produce a small beam waist (20 microns at $1/e^2$ beam radius, i.e., the radius of the beam where power equals $1/e^2$ of peak power) for the resonant modes 26 and 28. In a specific embodiment, the radii of curvature of mirrors 14 and 16 are approximately 5 cm, the spacing between mirrors 14 and 16 is approximately 6 mm and the spacing between flat mirrors 18 and 20 is approximately 1 mm. It is desirable for an opening angle 24 of the rhomboidal ring path to be small for phasematching of the nonlinear interaction to yield the shortest possible second harmonic (blue/green) wavelength and for the astigmatism to be minimized. Path 22 should be as close as possible to being parallel to the b-axis. The thickness of the crystal 12 is the limiting factor. In the preferred embodiment, the opening angle is approximately 9.1° and the phasematching wavelength is 996 nm.

The nonlinear resonator 10 is aligned with an orientation to receive optically incident input fundamental frequency beams 30 and 32. Beam 30 having its polarization perpendicular to the plane of ring path 22 and beam 32 having its polarization parallel to the ring path 22. The orientations of the polarizations of beams 30 and 32 are represented as a dot and arrow, respectively in FIG. 1. In a preferred embodiment, beams 30 and 32 are approximately 996 nm in wavelength and enter resonator 10 at an angle of 16.9° and 16.0°, respectively, relative to the axis 21. The diameters of beams 30 and 32 at the input mirror 14 are chosen by spatial mode matching considerations for most efficient excitation of fundamental resonator modes 26 and 28. Spatial mode matching is discussed in more detail in the article, "Laser Beams and Resonators," Applied Optics, Vol. 5, p. 1550, (1966).

The dielectric mirror coatings 14 and 16 are designed to maximize the build-up of intensity in resonator modes 26 and 28 when excited by input beams 30 and 32. The mirror 16 is chosen to be highly reflective at the wavelengths corresponding to both modes 26 and 28 and highly transmissive at the wavelength of the second harmonic (blue/green) output beams 34 and 36. The reflectivity of the input mirror 14 is chosen for optimum coupling of the input beams 30 and 32 to the cavity modes 26 and 28, taking into account both the internal losses of the nonlinear crystal, i.e. round trip loss of approximately 0.5% in a specific embodiment of a 6 mm crystal length, and the anticipated losses due to the nonlinear interaction. This optimum coupling is known as impedance matching and is described in the article "Efficient Second Harmonic Generation of a Diode-Laser-Pumped Nd:YAG Laser," by W.J. Kozlovsky, et al., IEEE J. Quantum Electronics, Vol. QE-24, No. 6, p. 913, (1988).

In a preferred embodiment, with 80% spatial mode matching of 50 milliwatts input beams mirror 14 has a reflectivity of 98.9% for the fundamental frequency of beams 30 and 32, and a reflectivity of less than 20% for the frequency of the second harmonic output beams 34 and 36. Mirror 16 has a high reflectivity approximately 99.9% for the frequency of beams 30 and 32, and a reflectivity of less than 20% for the frequency of the second harmonic output beams 34 and 36.

If each incident beam 30 and 32 is tuned to a resonant frequency of its corresponding resonator mode 26 and 28, respectively, the optical power in modes 26 and 28 will build up to a high intensity. In addition, the frequencies $f_1$ and $f_2$ of resonant modes 26 and 28 and the frequency $f_3 = f_1 + f_2$ of the generated beams 34 and 36 must satisfy the phasematching condition for the nonlinear interaction, $f_1 n_1 + f_2 n_2 = f_3 n_3$, where $f_1$ is the frequency of mode 26, $f_2$ is the frequency of mode 28, $f_3$ is the frequency of output beams 34 and 36, $n_1$ is the refractive index of the crystal 12 for mode 26, $n_2$ is the refractive index of the crystal 12 for mode 28, and $n_3$ is the refactive index of the crystal 12 for output beams 34 and 36.

The operation of resonator 10 may now be understood. Fundamental frequency beams 30 and 32 are coupled into resonator 10 at mirror 14. A small portion of beams 30 and 32 do not enter resonator 10 and are reflected as beams 40 and 42, respectively. Beams 30 and 32 resonate inside crystal 12 along beampath 22. Beams 30 and 32 travel along the same beampath 22 because they experience the same angle of reflection at each reflective surface. Note that reflective surfaces 18 and 20 are parallel to the b and c-axis, and that the tangential planes at the reflective points at mirrors 14 and 16 are parallel to the a and c-axis. It is this symmetry that eliminates the bireflection problem and allows the beams to resonate along the same beampath. A more detailed description of this bireflection problem is given below.

The beams 30 and 32 interact with crystal 12 to achieve a Type-II nonlinear interaction which results in the production of second harmonic (SH) light. This SH light exits mirror 14 as beam 34 and exits mirror 16 as beam 36.

Alternative embodiments of resonator 10 are possible. For example, the beams 30 and 32 may have different frequencies. Also, mirror 14 may be designed to resonate the second harmonic ligt rather than let it escape as beam 34. In such a case, only beam 36 will be output.

Figure 2:
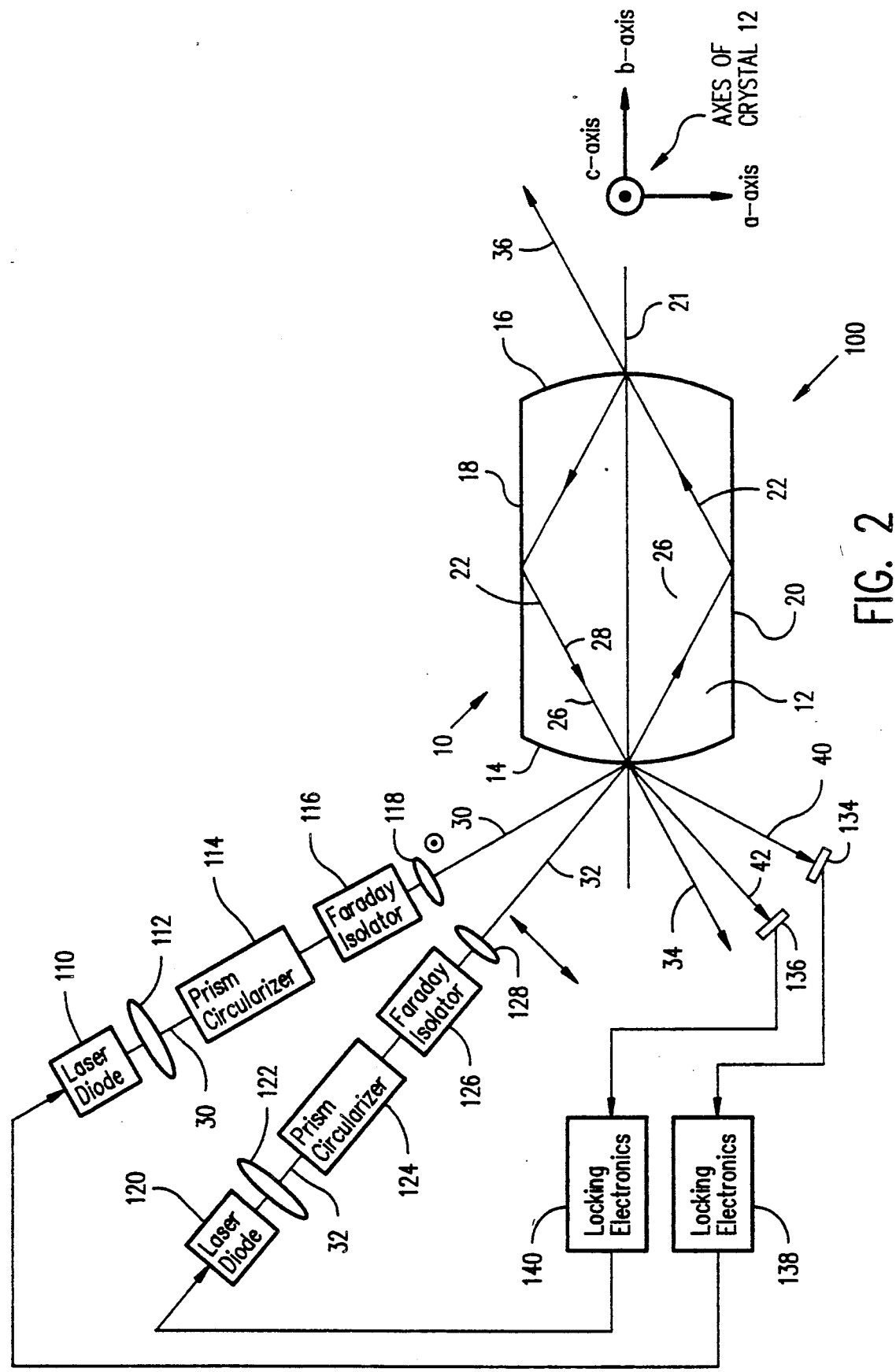
FIG. 2 shows a schematic diagram of a laser system for frequency upconversion of infrared laser diodes using the resonator of FIG. 1.

FIG. 2 shows a laser system 100 using the nonlinear resonator 10. A laser diode 110 generates a laser beam 30 which is collimated by a lens 112 and is circularized by a circularizing prism 114. The light 30 is then passed through a Faraday isolator 116. Faraday isolator 116 is used to prevent back-reflected light and scattered light from reaching diode laser 110. A lens 118 couples the light 30 into the fundamental spatial mode 26. A second laser diode 120 generates a laser beam 32 which is collimated by a lens 122 and is circularized by a circularizing prism 124. The light 32 is then passed through a Faraday isolator 126. Faraday isolator 126 is used to prevent back-reflected light and scattered light from reaching diode laser 120. A lens 128 couples the light 32 into the fundamental spatial mode 28.

In a preferred embodiment, laser diodes 110 and 120 are both strained-layer InGaAs/GaAs laser diodes operating at wavelengths of approximately 995–1000 nm. In this embodiment, the wavelength of output beams 34 and 36 are approximately 499 nm. In a another specific embodiment, laser diode 110 is a GaAlAs laser diode operating at a wavelength of 810–820 nm and laser diode 120 is a strained-layer InGaAs laser diode operating at a wavelength of 1040–1070 nm. In this embodiment, the wavelength of the output beams 34 and 36 are approximately 462 nm.

The frequencies of laser diodes 110 and 120 must be maintained at resonant frequencies of modes 26 and 28. In a preferred embodiment, this is done by sensing the beams 40 and 42 reflected from the cavity with optical detectors 134 and 136, respectively. A pair of locking electronic circuits 138 and 140 are connected to detectors 134 and 136, respectively. Circuits 138 and 140 are connected to and control lasers 110 and 120, respectively. Reflected beams 40 and 42 contain FM signals. The FM signals contained in reflected beams 40 and 42 can be used by circuits 138 and 140 to adjust the frequencies of laser diodes 110 and 120 to match the cavity resonance frequencies. This FM locking techniques is taught in W. J. Kozlovsky, et al., Applied Physics Letters, Vol. 56, p. 2291, (1990). Other frequency locking techniques may also be used.

Figure 3C:
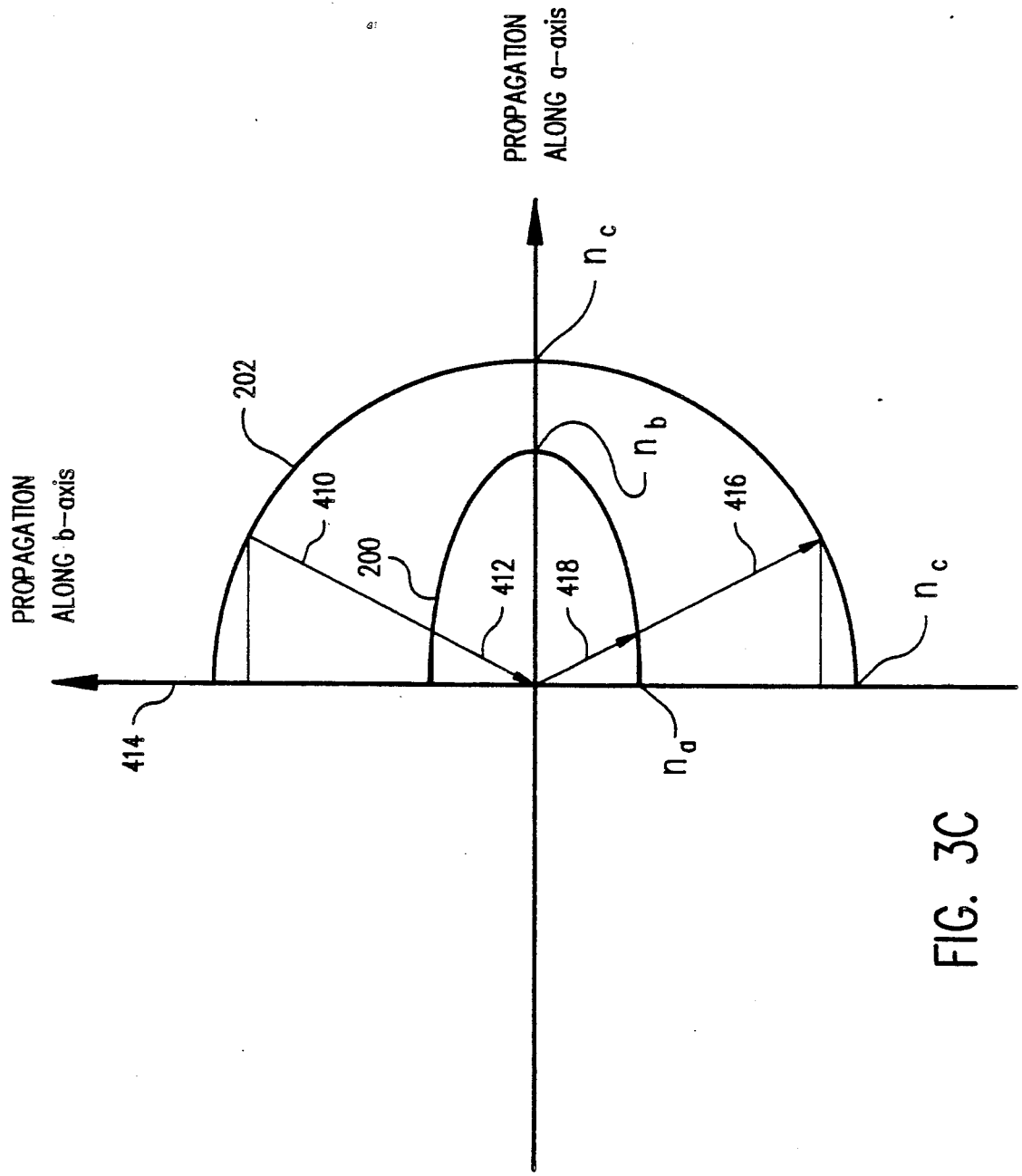
FIG. 3C is a slowness curve which shows how bireflection is eliminated using mirrors parallel to planes of crystal symmetry.

FIGS. 3A, 3B and 3C are slowness curves which explain why orthogonally polarized modes 26 and 28 can have the same geometric ring path 22 in the nonlinear resonator 10 and why the unique geometry of this invention is required. FIG. 3A shows a slowness curve for the nonlinear material KTP. The curves 200 and 202 depict the refractive index characteristic of a light wave propagating at an angle 204 with respect to the a-axis of the KTP crystal; that is, the curves indicate the speed at which a light wave of a given polarization will travel in a particular direction within the crystal. Curve 200 applies to a lightwave polarized parallel to the a-b plane; curve 202 applies to a lightwave polarized perpendicular to the a-b plane. If the light wave is polarized perpendicular to the a-b plane, it will have refractive index $n_1$ as given by the length of arrow 206 (the distance from origin to curve 202). If the light wave is polarized parallel to the a-b plane, it will have refractive index $n_2$ as given by the length of arrow 208 (the distance from the origin to curve 200). As a specific example, if angle 204 is 90°, the light waves are propagating along the b-axis of the crystal. The light wave polarized parallel to the a-b plane will have index of refraction $n_a$ and the light wave polarized perpendicular to the a-b plane will have index of refraction $n_c$ FIG. 3B shows the case typical of a three-mirror ring resonator as is commonly used for Type-I frequency doubling of GaAlAs lasers with the nonlinear material $KNbO_3$. A wave with polarization perpendicular to the a-b plane is incident upon reflecting surface 314, and is represented by an arrow 310 oriented in the direction of propagation and with length (the distance from curve 202 to the origin) equal to the refractive index of the wave, in this case, $n_c$ Reflecting surface 314 is oriented at an angle to the crystallographic a-and b-axes. Electromagnetic boundary conditions require that the reflected wave travel in such a direction that that its effective speed along the direction of the reflecting surface be the same as that of the incident wave. The effective speed of the wave along the direction of the reflecting surface is represented by the projection of arrow 310 onto the reflecting surface 314. Therefore, for the wave represented by arrow 310, this condition is satisfied by a reflected wave propagating in the direction of arrow 316. The length of arrow 316 is from the origin to curve 202. A second incident wave, represented by arrow 312, is polarized parallel to the a-b plane and is incident upon reflecting surface 314. The length of arrow 312 is from curve 200 to the origin. In this case, the wave reflected from the boundary must travel in the direction of arrow 318 in order for the effective speed along the direction of the reflecting surface 314 to be the same as that of the incident wave. The length of arrow 318 is from the origin to curve 200. In this case, it can be seen that even though both waves are incident upon the reflecting surface 314 at the same angle, they are reflected from the surface at two different angles.

This bireflection problem occurs in the standard triangular three sided ring resonator because two of the reflective surfaces are non-symmetrical with respect to the crystal axes.

FIG. 3C shows the case where the reflecting surface 414 is parallel to the crystallographic b-axis. In this case, an incident wave polarized perpendicular to the a-b plane (represented by arrow 410) is reflected in the direction of arrow 416. An incident wave polarized parallel to the a-b plane (represented by arrow 412) is reflected in the direction of arrow 418, which is now in the same direction as arrow 412. Hence, both incident waves are reflected at the same angle, regardless of their polarization. The lengths of arrows 410 and 412 are from curves 202 and 200, respectively, to the origin. The lengths of arrows 416 and 418 are from the origin to curves 202 and 200, respectively.

These figures show that in order to have the same ring path 22 for both orthogonally polarized modes 26 and 28 of FIG. 1, it is necessary that mirrors 14, 16, 18, and 20 be disposed parallel to axes of crystal symmetry. Our invention utilizes flat TIR mirrors 18 and 20 which are parallel to the crystal b-axis, and spherical mirrors 14 and 16 having centers of curvature lying along the crystal b-axis. The ring path 22 is symmetric about both the crystal b-axis and the crystal a-axis.

While generation of blue-green light using KTP and GaAlAs and strained-layer InGaAs diode lasers has been used in specific embodiments of the present invention, generation of other wavelengths using other nonlinear crystals and other lasers is possible. Other nonlinear crystals such as lithium niobate, lithium equilibrated lithium niobate, lithium potassium niobate, lithium iodate, KTP, KTA, barium borate, LBO and periodically-poled KTP and lithium niobate may have Type-II nonlinear interactions requiring input beams of two orthogonal polarizations. The fundamental wavelengths required for these interactions can be generated from various laser systems, including GaAlAs laser diodes, strained-layer InGaAs laser diodes, InGaAsP laser diodes, AlGaInP laser diodes, single-frequency titanium:sapphire and dye laser systems and other single frequency solid-state lasers such as Nd:YAG lasers.

Figure 4:
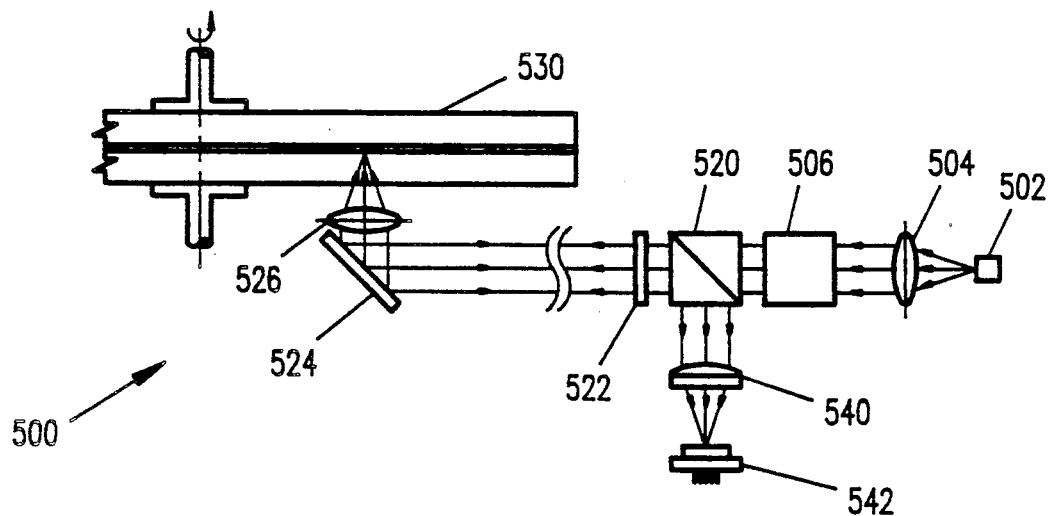
FIG. 4 shows a schematic diagram of a phase-change storage system of the present invention.

FIG. 4 shows a phase change optical data storage system 500 which uses a laser system 502. Laser system 100 may be used for system 502. The light from system 502 is collimated by a lens 504 and passes to a circularizing optical element 506. Element 506 emits light having a circular cross-sectional beam pattern. Element 506 may be a prism.

The light then passes through a polarizing beam splitter 520 and a quarter-wave plate 522. The light is reflected off of a mirror 524 and focused by a lens 526 onto an optical recording medium 530. Medium 530 may be a phase change type of optical recording medium.

The light reflected from medium 530 returns through lens 526, is reflected off of mirror 524, passes through plate 522 to beam splitter 520. Reflected light is then diverted by beam splitter 520 to an astigmatic lens 540. Lens 540 focuses the reflected light onto an optical detector 542. The recorded spots of the medium 530 have different reflectivities and these differences are detected by optical detector 542 as data one and zeros. Detector 542 also provides focus and tracking signals.

Figure 5:
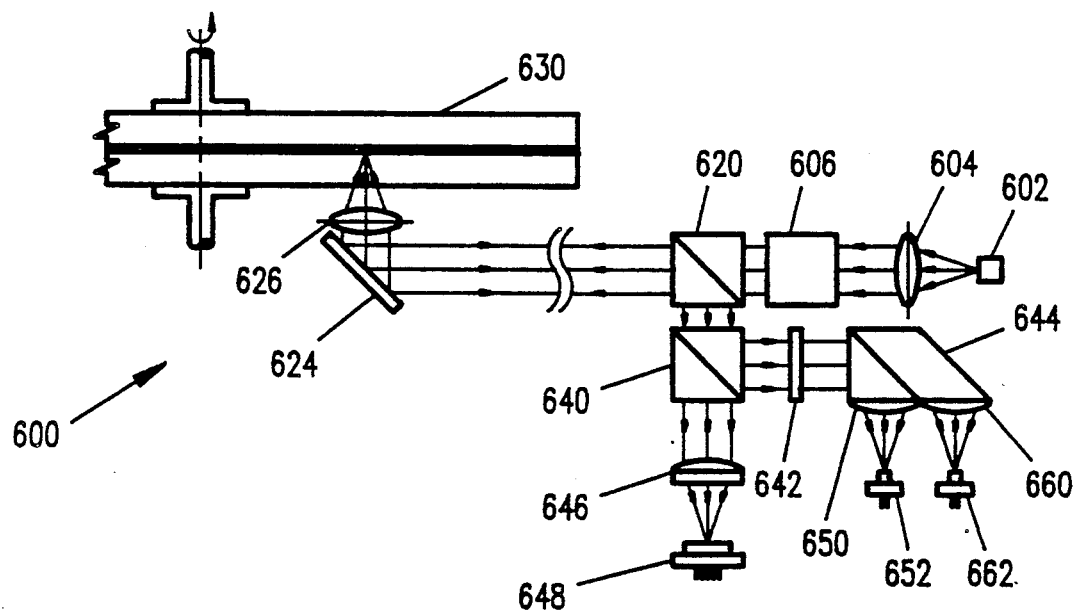
FIG. 5 shows a schematic diagram of a magneto-optic storage system of the present invention

FIG. 5 shows a magneto-optic data storage system 600 which uses a laser system 602. Laser system 100 may be used for system 602. The light from system 602 is collimated by a lens 604 and passes to a circularizing optical element 606. Element 606 emits light having a circular cross-sectional beam pattern. Element 606 may be a prism.

The light then passes through leaky polarizing beam splitter 620. Beam splitter 620 has reflectivities of Rp greater than zero and Rs approximately equal to 1 (s and p represent the orthogonal polarization components of the light). The light is then reflected off of a mirror 624 to a lens 626 and is focused onto an optical recording medium 630. Medium 630 may be a magneto-optic type of optical recording medium.

The light reflected from medium 630 returns through lens 626, reflects off of mirror 624, and enters beam splitter 620. Beam splitter 620 diverts the reflected light to an amplitude beam splitter 640. Reflected data light is diverted to a half-wave plate 642 and to a beam splitter 644. Reflected light of other amplitudes passes straight through beam splitter 640. This light is focused by an astigmatic lens 646 to a quad detector 648 to produce tracking and focus signals.

The medium 630 has recorded spots having either an up or down magnetic domain. The light reflected off of these spots have their plane of polarization rotated one way or the other depending upon the direction of the magnetic domain of the spot. Beam splitter 644 separates the reflected light depending upon which way the plane of polarization has been rotated. The separated beams go to a lens 650 and an optical detector 652 or to a lens 660 and an optical detector 662. The difference in output signals of output signals of detectors 652 and 662 are the data ones and zeros. A more detailed explanation of optical disk drive systems is given in "Gradiant-Index Optics and Miniature Optics," SPIE, Vol. 935, p. 63 (1988) by Glenn T. Sincerbox.

The advantages of the present invention may now be understood. It has been discovered that the efficiency of Type-II nonlinear processes such as frequency doubling and sum-frequency mixing may be enhanced using a monolithic crystal ring resonator in which four mirrors define the path of light within the resonator. These mirrors must be placed parallel to axes of crystal symmetry in order to eliminate bireflection so that both polarizations required for the nonlinear interaction traverse the same path within the crystal. This invention is of particular use for generation of blue/green light using a KTP crystal fashioned into a monolithic resonator for second-harmonic generation and sum-frequency mixing of GaAlAs and InGaAs laser diodes. An efficient output of blue/green light is produced which is especially suited to optical storage systems.

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. A laser system comprising:

a first radiation source for producing radiation of a first polarization;

a second radiation source for producing radiation of a second polarization different from said first polarization;

a nonlinear crystal for receiving the first and second polarization radiation and producing second harmonic radiation; and a ring resonator integral to the nonlinear crystal for resonating the first and second polarization radiation, the resonator having a plurality of reflective surfaces which are symmetrical with respect to the axes of the nonlinear crystal, whereby the first and second polarization radiation is resonated without experiencing bireflection.

2. The system of claim 1, wherein the first and second radiation sources are diode lasers.

3. The system of claim 1, wherein the nonlinear crystal is a Type-II nonlinear crystal.

4. The system of claim 1, wherein the reflective surfaces form a paralellogram shaped resonator path.

5. A method for frequency conversion of radiation comprising the steps of:

generating a first radiation beam of a first polarization;

generating a second radiation beam of a second polarization different from said first polarization;

coupling the first and second polarization radiation beams to a nonlinear crystal; and resonating the first and second polarization radiation beams inside the nonlinear crystal by reflecting the beams off of a plurality of reflective surfaces which are symmetrical with respect to the axes of the nonlinear crystal to produce second harmonic generated radiation, whereby the first and second polarization radiation beams are resonated without experiencing bireflection.

6. The method of claim 5 wherein, the radiation beams are produced by laser diodes.

7. The method of claim 5 wherein, the nonlinear crystal is a Type-II nonlinear crystal.

8. The method of claim 5, wherein the reflective surfaces form a parallelogram shaped resonator path.

9. A laser system comprising:

a first laser for producing a radiation beam of a first polarization;

a second laser for producing a radiation beam of a second polarization different from said first polarization;

a nonlinear crystal for receiving the first and second polarization radiation and for producing second harmonic radiation; and a resonator for resonating the first and second polarization radiation, having four reflective surfaces integral to the nonlinear crystal, each of the reflective surfaces being symmetrical with respect to the axes of the nonlinear crystal, whereby the first and second polarization radiation is resonated without experiencing bireflection.

10. The system of claim 9, wherein the first and second radiation beams are 995-1000 nm in wavelength.

11. The system of claim 9, wherein the first radiation beam is 810-820 nm in wavelength and the second radiation beam is 1040-1070 nm in wavelength.

12. The system of claim 9, wherein the nonlinear crystal is KTP.

13. The system of claim 9, wherein the reflective surfaces are arranged such that the first and second polarization beams travel along a parallelogram shape beam path.

14. A laser system comprising:

a first radiation source for producing radiation of a first polarization;

a second radiation source for producing radiation of a second polarization different from said first polarization;

a nonlinear crystal for receiving the first and second polarization radiation and for producing second harmonic radiation;

a ring resonator arranged around the nonlinear crystal for resonating the first and second polarization radiation, the resonator having a plurality of reflective surfaces which are symmetrical with respect to the axes of the nonlinear crystal, whereby the first and second polarization radiation is resonated without experiencing bireflection;

an optical data storage medium;

an optical transmission means for directing said second harmonic radiation from the resonator to the optical data storage medium; and an optical reception means for receiving a reflected second harmonic radiation beam from the medium and for providing a data signal responsive thereto.

* * * * *